(12) United States Patent
Yamada et al.

(10) Patent No.: US 8,886,350 B2
(45) Date of Patent: Nov. 11, 2014

(54) DISPLACEMENT CALCULATION METHOD, DRAWING DATA CORRECTION METHOD, SUBSTRATE MANUFACTURING METHOD, AND DRAWING APPARATUS

(75) Inventors: Ryo Yamada, Kyoto (JP); Satoru Yasaka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 538 days.

(21) Appl. No.: 13/248,514

(22) Filed: Sep. 29, 2011

(65) Prior Publication Data

US 2012/0083916 A1 Apr. 5, 2012

(30) Foreign Application Priority Data

Sep. 30, 2010 (JP) ................. 2010-220717

(51) Int. Cl.
*G06F 19/00* (2011.01)
*H05K 3/00* (2006.01)
*G03F 7/20* (2006.01)
*G03F 9/00* (2006.01)
*H05K 3/06* (2006.01)
*H05K 1/02* (2006.01)

(52) U.S. Cl.
CPC ............ *H05K 3/0008* (2013.01); *H05K 3/06* (2013.01); *H05K 2203/166* (2013.01); *G03F 7/70291* (2013.01); *G03F 7/70616* (2013.01); *H05K 2201/09918* (2013.01); *G03F 9/7003* (2013.01); *H05K 1/0269* (2013.01); *H05K 3/0005* (2013.01); *H05K 2201/09136* (2013.01); *G03F 7/70508* (2013.01)
USPC .......................... 700/105; 702/150

(58) Field of Classification Search
CPC ............ G21K 4/04; H01J 2237/3175; H01J 2237/2045; H01J 2237/230438; G03F 7/70291; G03F 7/70508; G03F 7/70616; H05K 3/0008; H05K 3/06; H05K 2201/09136
USPC ........... 700/105, 279; 702/150; 250/427, 311, 250/491.1
See application file for complete search history.

(56) References Cited

U.S. PATENT DOCUMENTS

| | | | |
|---|---|---|---|
| 5,499,099 A | 3/1996 | Sato et al. | 356/400 |
| 5,739,899 A | 4/1998 | Nishi et al. | 355/53 |
| 5,808,910 A * | 9/1998 | Irie et al. | 700/279 |
| 5,965,895 A * | 10/1999 | Satoh et al. | 250/491.1 |
| 6,635,884 B2 * | 10/2003 | Plontke et al. | 250/427 |
| 2002/0163628 A1 | 11/2002 | Yui et al. | 355/53 |

(Continued)

FOREIGN PATENT DOCUMENTS

| | | |
|---|---|---|
| JP | 6-252027 | 9/1994 |
| JP | 8-316123 | 11/1996 |

(Continued)

*Primary Examiner* — Kidest Bahta
(74) *Attorney, Agent, or Firm* — Ostrolenk Faber LLP

(57) ABSTRACT

Correction values ($\Delta X1$ to $\Delta X4$) at the X position (X=xe) of a target point (E (xe, ye)) are calculated by calculating the amounts of shift ($\Delta X$) in the positions of alignment marks (M11 to M14, M21 to M24, M31 to M34, M41 to M44) in the X direction and plotting first spline curves (SL1) using the amounts of shift. Then, a first sub-spline curve (SL1S) is plotted using the correction values ($\Delta X1$ to $\Delta X4$) in order to calculate a correction value ($\Delta Xe$) at the Y position (Y=ye) of the target point (E (xe, ye)), and the calculated correction value is taken as the correction amount in the X direction. The correction amount in the Y direction is also calculated in the same manner.

17 Claims, 16 Drawing Sheets

(56) References Cited

U.S. PATENT DOCUMENTS

| | | | |
|---|---|---|---|
| 2005/0002070 A1 | 1/2005 | Nakaya et al. | |
| 2005/0213806 A1 | 9/2005 | Hanina et al. | |
| 2006/0029447 A1 | 2/2006 | Nakaya et al. | |
| 2009/0242807 A1 | 10/2009 | Tsuruta et al. | 250/492.2 |
| 2010/0207017 A1 | 8/2010 | Horiuchi et al. | 250/252.1 |

FOREIGN PATENT DOCUMENTS

| | | |
|---|---|---|
| JP | 09-015834 | 1/1997 |
| JP | 2000-216080 | 8/2000 |
| JP | 2000-286178 | 10/2000 |
| JP | 2001-265012 | 9/2001 |
| JP | 2002-170754 | 6/2002 |
| JP | 2005-37911 | 2/2005 |
| JP | 2005-108981 | 4/2005 |
| JP | 2005-524982 | 8/2005 |
| JP | 2007-129056 | 5/2007 |
| JP | 2008-3441 | 1/2008 |
| JP | 2009-260273 | 11/2009 |
| JP | 2010-192538 | 9/2010 |
| JP | 2010-204421 | 9/2010 |

* cited by examiner

DISPLACEMENT CALCULATION METHOD, DRAWING DATA CORRECTION METHOD, SUBSTRATE MANUFACTURING METHOD, AND DRAWING APPARATUS

TECHNICAL FIELD

The present invention relates to a displacement calculation method, a drawing data correction method, a substrate manufacturing method, and a drawing apparatus, and in particular, relates to correction processing performed on drawing data in a direct drawing apparatus that targets a printed board, a semiconductor substrate, a liquid crystal substrate, or the like for drawing.

BACKGROUND ART

Conventionally known is a direct drawing apparatus (direct imaging apparatus) that draws and forms a desired circuit pattern or the like by performing continuous local exposure on a drawing target object such as a printed board, a semiconductor substrate, or a liquid crystal substrate (hereinafter also referred to simply as a "substrate") by scanning the substrate with exposure light such as laser light.

The direct drawing apparatus performs drawing of a circuit pattern in accordance with drawing data, which is data converted from design data of the circuit pattern and described in a format that can be processed by the direct drawing apparatus. Although a substrate such as described above may undergo deformation such as warpage, contortion, or distortion that accompanies upstream processing, the design data is normally created without consideration given to such deformation. Thus, even if converted drawing data is used as is to draw a circuit pattern, it is difficult to achieve a satisfactory drawing quality due to, for example, misalignment with a previously formed circuit pattern, and an improvement in yield cannot be achieved.

Accordingly, with this type of direct drawing apparatus, it has been proposed to perform correction processing called local alignment in which the shape of a substrate targeted for drawing is measured in advance, displacements of points (hereinafter also referred to as "target points") on the substrate are calculated from the obtained measurement result, and the drawing data is itself corrected so as to conform to the displacements, and to perform drawing using the corrected drawing data. In Japanese Patent Application Laid-open No. 2008-3441 (Document 1), correction amounts of target drawing data are calculated from position information of four vertices of a square surrounding the drawing data.

With the technique described in Document 1, since the correction amounts are calculated from the position information of the four neighboring points surrounding target drawing data, correction for local distortion of a substrate occurring in the vicinity of the drawing data is possible, but it is not possible to make precise correction in the case where distortion occurs over a larger area of a substrate, for example, if the entire substrate is distorted in an undulating manner.

SUMMARY OF INVENTION

The present invention is directed toward a displacement calculation method for calculating a displacement of a target point based on displacements of a plurality of reference points arranged in a grid on a surface of a substrate, along a first coordinate axis direction and a second coordinate axis direction that intersect each other, and it is an object of the present invention to perceive the tendency of distortion over a wide area of the substrate and accurately calculate the displacement of the target point, even if the substrate undergoes non-local distortion.

The displacement calculation method according to the present invention includes a step of obtaining position information of a plurality of reference points defined on a substrate surface, a step of detecting displacements of reference points in the vicinity of a target point in first and second coordinate axis directions based on the position information, and a step of performing a computation for a displacement of the target point. The step of performing a computation executes, for displacements in one coordinate axis direction out of the first and second coordinate axis directions, of the reference points in the vicinity of the target point, A: a first spline calculation step of calculating a first spline curve that indicates a relationship between displacement values and first coordinate axis values of reference points included in each group, the reference points included in the each group being aligned in the first coordinate axis direction and having a same second coordinate axis value, B: a first spline-indicated-value calculation step of calculating, as a first spline-indicated value, a value indicated by the first spline curve of the each group at a first coordinate axis value of the target point, C: a first sub-spline calculation step of calculating a first sub-spline curve that indicates a relationship between first spline-indicated values of respective groups and second coordinate axis values of the respective groups, and D: a first sub-spline-indicated-value calculation step of calculating a value indicated by the first sub-spline curve at a second coordinate axis value of the target point.

According to the present invention, even if a substrate undergoes non-local distortion, it is possible to perceive the tendency of distortion over a wide area of the substrate and accurately calculate the displacement of the target point.

In a preferred embodiment of the present invention, the step of performing a computation further executes, for the displacements in the one coordinate axis direction, E: a second spline calculation step of calculating a second spline curve that indicates a relationship between displacement values and second coordinate axis values of reference points included in each group, the reference points included in the each group being aligned in the second coordinate axis direction and having a same first coordinate axis value, F: a second spline-indicated-value calculation step of calculating, as a second spline-indicated value, a value indicated by the second spline curve of the each group at the second coordinate axis value of the target point, G: a second sub-spline calculation step of calculating a second sub-spline curve that indicates a relationship between second spline-indicated values of respective groups and first coordinate axis values of the respective groups, and H: a second sub-spline-indicated-value calculation step of calculating a value indicated by the second sub-spline curve at the first coordinate axis value of the target point, and an average value of the value calculated in the first sub-spline-indicated-value calculation step and the value calculated in the second sub-spline-indicated-value calculation step is calculated. Accordingly, it is possible to more accurately calculate the displacement of the target point.

The present invention is also directed toward a drawing data correction method, a substrate manufacturing method, and a drawing apparatus.

These and other objects, features, aspects and advantages of the present invention will become more apparent from the following detailed description of the present invention when taken in conjunction with the accompanying drawings.

DESCRIPTION OF EMBODIMENTS

Embodiment 1

Overview of Drawing Apparatus

Figure 1A:
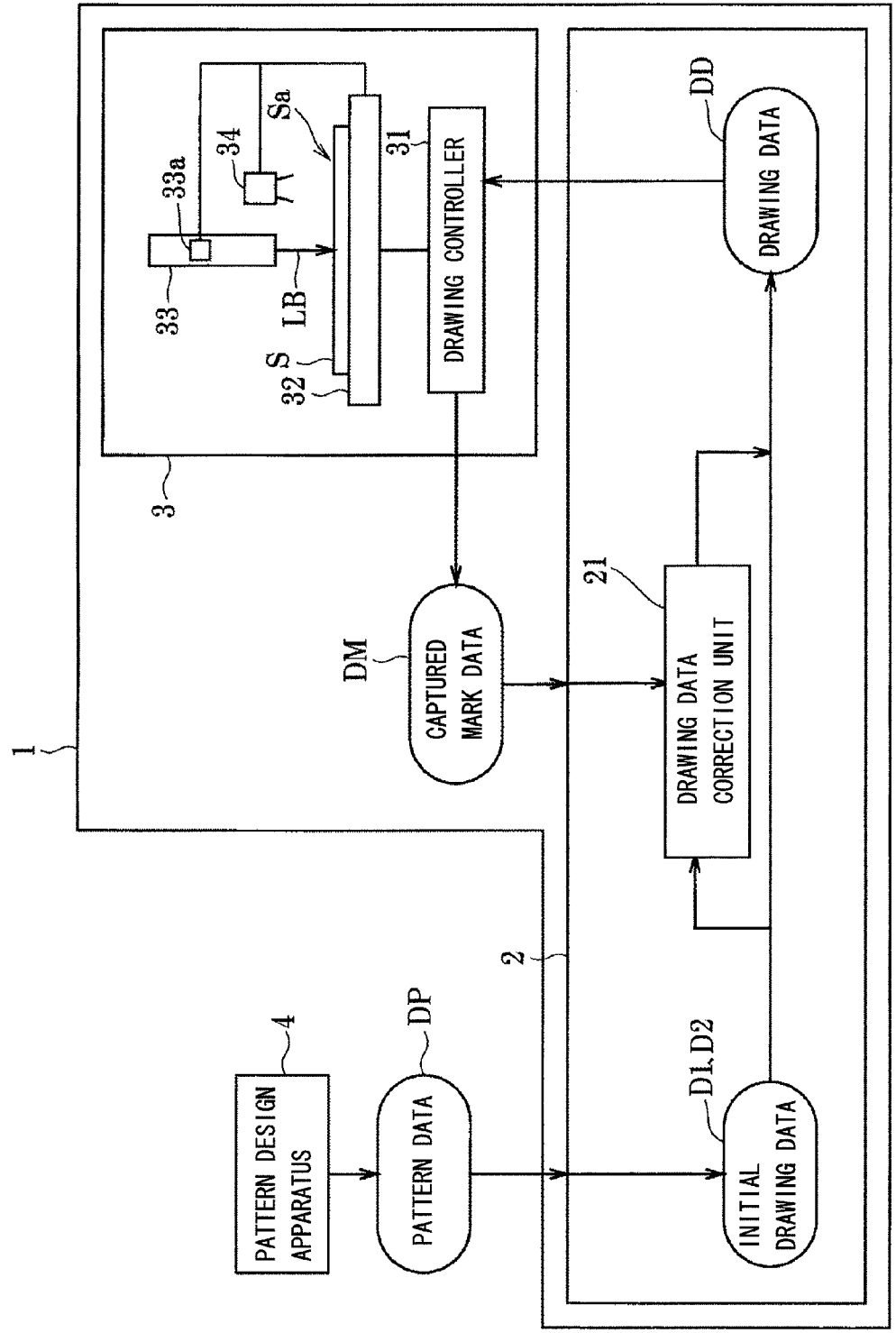
FIG. 1A is a diagram showing a schematic configuration of a drawing apparatus according to an embodiment of the present invention.

FIG 1A is a diagram showing a schematic configuration of a drawing apparatus 1 according to Embodiment 1 of the present invention. The drawing apparatus 1 is a direct drawing apparatus (direct imaging apparatus) that draws an exposure image of a desired circuit pattern on a substrate S targeted for drawing, such as a printed board, a semiconductor substrate, or a liquid crystal substrate, by performing continuous local exposure on the substrate S by scanning the substrate S with laser light LB serving as exposure light.

The drawing apparatus 1 is primarily constituted by a data processor 2 that generates drawing data DD and an exposure device 3 serving as a drawing part that actually performs drawing (exposure) based on the drawing data DD. Note that the data processor 2 and the exposure device 3 do not need to be integrated, and may be physically separated from each other as long as the transfer of data is possible between the two.

Figure 1B:
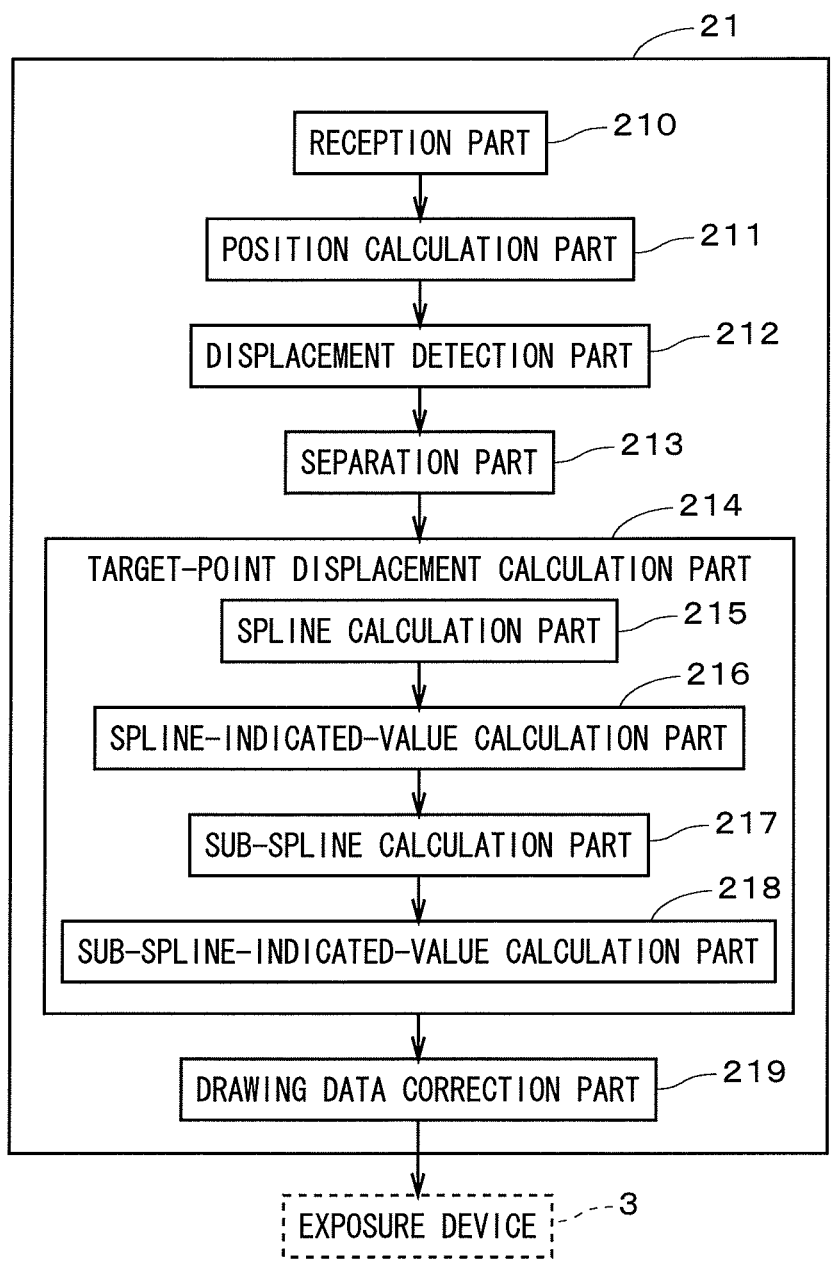
FIG. 1B is a diagram showing a functional configuration of a drawing data correction unit.

The data processor 2 is configured by a so-called microcomputer equipped with, for example, a computing circuit and a storage device, and carries out various types of computation processing including the calculation of correction amounts and correction processing performed by a built-in drawing data correction unit 21, which will be described later. FIG. 1B is a diagram showing a functional configuration of the drawing data correction unit 21. Specifically, the drawing data DD serving as processing data in the exposure device 3 is generated based on pattern data DP, which is design data of a circuit pattern created by a pattern design apparatus 4 such as a CAD. The pattern data DP is normally described as vector data such as polygons. On the other hand, the exposure device 3 performs exposure based on the drawing data DD described as raster data, and therefore it is necessary for the data processor 2 to convert the pattern data DP into raster data. Note that in the drawing apparatus 1 according to the present embodiment, drawing data DD is generated after, if necessary, performing correction processing according to a method described later. This enables a circuit pattern as desired to be drawn on the substrate S even if the substrate S undergoes deformation.

The exposure device 3 is a device for performing drawing on the substrate S in accordance with the drawing data DD provided by the data processor 2. The exposure device 3 primarily includes a drawing controller 31 that controls operations of various parts, a stage 32 on which the substrate S is placed, a light source 33 that emits the laser light LB, and an image pickup part 34 that captures an image of a drawing surface Sa of the substrate S placed on the stage 32.

In the exposure device 3, at least one of the stage 32 and the light source 33 is configured to be movable in the main scanning direction and the sub-scanning direction that are two orthogonal axial directions in a horizontal plane. This enables the substrate S placed on the stage 32 to be irradiated with the laser light LB emitted from the light source 33 while the stage 32 and the light source 33 move relatively in the main scanning direction. Alternatively, the stage 32 may also be configured to be rotatably movable in a horizontal plane, and the light source 33 may be configured to be movable in the vertical direction. The type of the laser light LB used may be determined as appropriate according to, for example, the type of substrate S targeted for drawing.

Furthermore, the light source 33 is equipped with a modulation part 33a such as a digital mirror device (DMD), so that the substrate S on the stage 32 is irradiated with the laser light LB that has been emitted from the light source 33 while being modulated by the modulation part 33a. More specifically, prior to drawing, first the drawing controller 31 sets irradiation of the laser light LB to on or off in units of modulation performed by the modulation part 33a in accordance with the content described in the drawing data DD in which whether or not to perform exposure is set for each pixel position. While the light source 33 is being moved relative to the stage 32 (relative to the substrate S placed thereon) in the main scanning direction, the laser light LB is emitted from the light source 33 in accordance with the on/off settings, as a result of which the substrate S on the stage 32 is irradiated with the laser light LB that has been modulated based on the drawing data DD.

When a certain position is scanned with the laser light LB in the main scanning direction and exposure at that position has ended, the light source 33 moves relatively by a predetermined distance in the sub-scanning direction, and that position is once again scanned with the laser light LB in the main scanning direction. By repeating this operation, an image (exposure image) in accordance with the drawing data DD is formed on the substrate S.

The image pickup part 34 is provided primarily for capturing an image of alignment marks M formed on the surface, namely, the drawing surface Sa, of the substrate S placed on the stage 32. The captured image of the alignment marks is provided as captured mark data DM to the data processor 2 as described above. Of course, a configuration is also possible in which the image pickup part 34 performs image capture for other purposes.

Note that the formation mode of alignment marks on the substrate S is not particularly limited as long as the positions of the alignment marks can be specified precisely. For example, a mode using alignment marks such as through holes formed by machining is possible, or a mode using alignment marks patterned through print processing or photolithographic processing is also possible. In the present embodiment, alignment mark data is included in pattern data DP1 of a first layer together with a copper wiring pattern serving as a pattern of the first layer, and so alignment marks are formed simultaneously with the copper wiring pattern on the surface of the substrate S.

Basic Concept of Correction Processing

The following is a description of the basic concept of correction processing performed for generation of the drawing data DD.

Generally, the pattern data DP is created assuming a substrate of an ideal shape whose drawing surface is flat without deformation, but there are cases where actual substrates undergo deformation such as warpage, contortion, or distortion that accompanies upstream processing. In such a case, a desired product cannot be obtained even if a circuit pattern is drawn in the arrangement position on the substrate S as set in the pattern data DP, and therefore local alignment processing for converting coordinates indicating a position where to form a circuit pattern depending on the condition of the substrate S is required in order to form a circuit pattern that is commensurate with the state of distortion or the like that the substrate S has undergone. The correction processing performed when generating the drawing data DD in the present embodiment is simply called coordinate transformation processing.

Figure 2A:
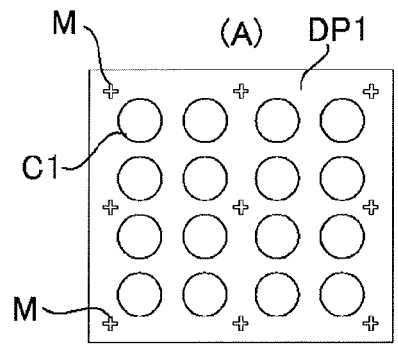
FIGS. 2A through 2G are diagrams showing drawing data and substrate distortion.
Figure 2B:
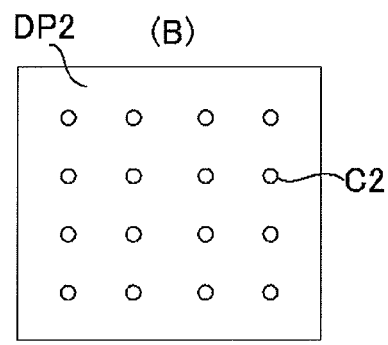
Figure 2C:
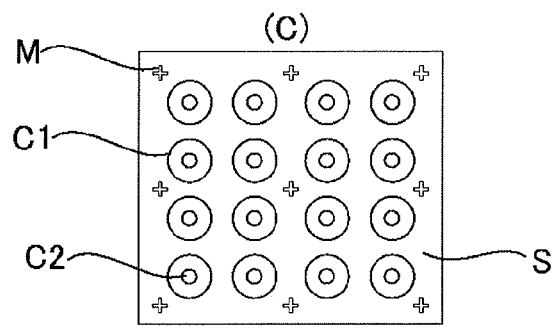

FIGS. 2A through 2G are diagrams illustrating the relationship between the pattern data DP1 and pattern data DP2 in the local alignment performed by the exposure device 3. In the present example, the substrate S is exposed to light in accordance with first the pattern data DP1 including alignment marks M shown in FIG. 2A and then the pattern data DP2 shown in FIG. 2B, and the ultimate aim is to form a pattern as shown in FIG. 2C in which circles C1 and C2 included respectively in the two pattern data pieces DP1 and DP2 are superimposed.

Note that conceivable examples of such cases where two pattern data pieces are superimposed include a case of forming a copper wiring pattern and a solder resist pattern of a printed board, in which the solder resist pattern is superimposed on the copper wiring pattern, a case of forming first and second layers of a wiring pattern of a multilayer printed board, a case of forming a front-face wiring pattern and a back-face wiring pattern of a double-side printed board (in this case, if the back-face wiring pattern is formed by exposure from the back face side, the pattern is inverted).

Now consider the case of manufacturing a printed board S by forming a copper wiring pattern of the printed board S in accordance with the pattern data DP1 and forming a solder resist pattern to be superimposed on the copper wiring pattern in accordance with the pattern data DP2. In this case, first the copper wiring pattern is formed by forming a photoresist film on a copper layer formed on the entire surface of the printed board S, exposing the photoresist film to light in accordance with drawing data DD generated from the pattern data DP1, and performing development and etching. Subsequently, a solder resist film is formed by application or lamination on the copper wiring pattern of the printed board S, and exposure in accordance with drawing data DD generated from the pattern data DP2 and development are performed.

Figure 2D:
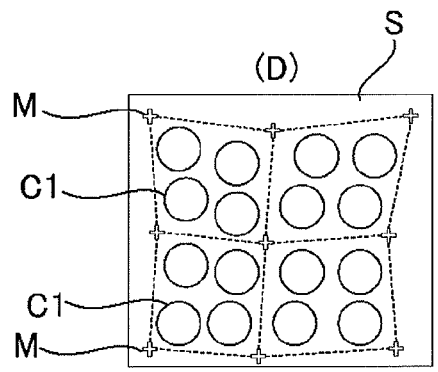
Figure 2E:
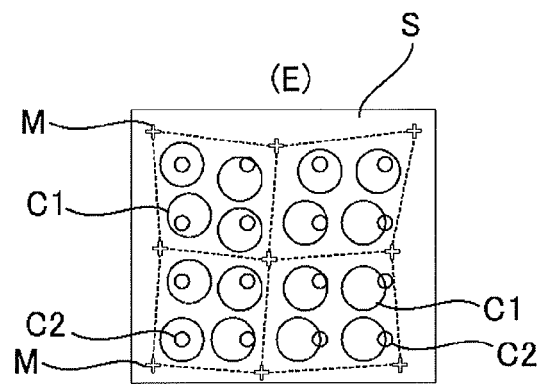

In this case, however, since the process of forming a copper wiring pattern includes development, etching, and other steps such as washing and drying by heating that accompany development and etching steps, the printed board S may be caused to expand and contract or be distorted, which may cause deformation of the printed board S and deformation of the pattern formed thereon as shown in FIG. 2D. If drawing data DD is generated without modification to the pattern data DP2 and the printed board S is exposed to light in accordance with that drawing data DD, the final pattern to be formed is as shown in FIG. 2E, in which the relative positions of the circles C1 and C2 included respectively in the two pattern data pieces DP1 and DP2 are shifted, and therefore the intended pattern cannot be formed.

Figure 2F:
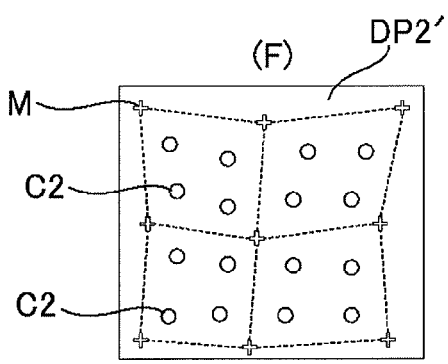
Figure 2G:
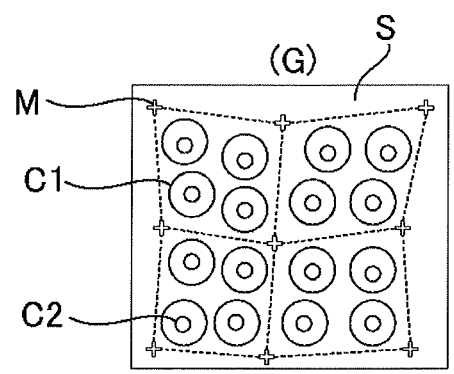

Accordingly, in this case, the pattern data DP2 is not used as is for exposure, but instead it is corrected and modified into pattern data DP2' as shown in FIG. 2F in consideration of deformation of the printed board S (that is, modification and displacements in the pattern data DP1 formed on the printed board S). Then, drawing data DD is generated from the modified pattern data DP2' and used for exposure so that the final pattern to be formed is as shown in FIG. 2G This correction and modification of the pattern data DP2 is called local alignment. Note that the deformation of the printed board S can be recognized by, for example, reading out position indicators (e.g., alignment marks M) formed on the printed board S as reference points through image capture or the like and finding out displacements of the position indicators. Note that the pattern data DP2 does not include alignment marks M, but in order to show the positional relationship, alignment marks are illustrated in FIG. 2F.

Steps for Manufacturing Printed Board

Figure 3:
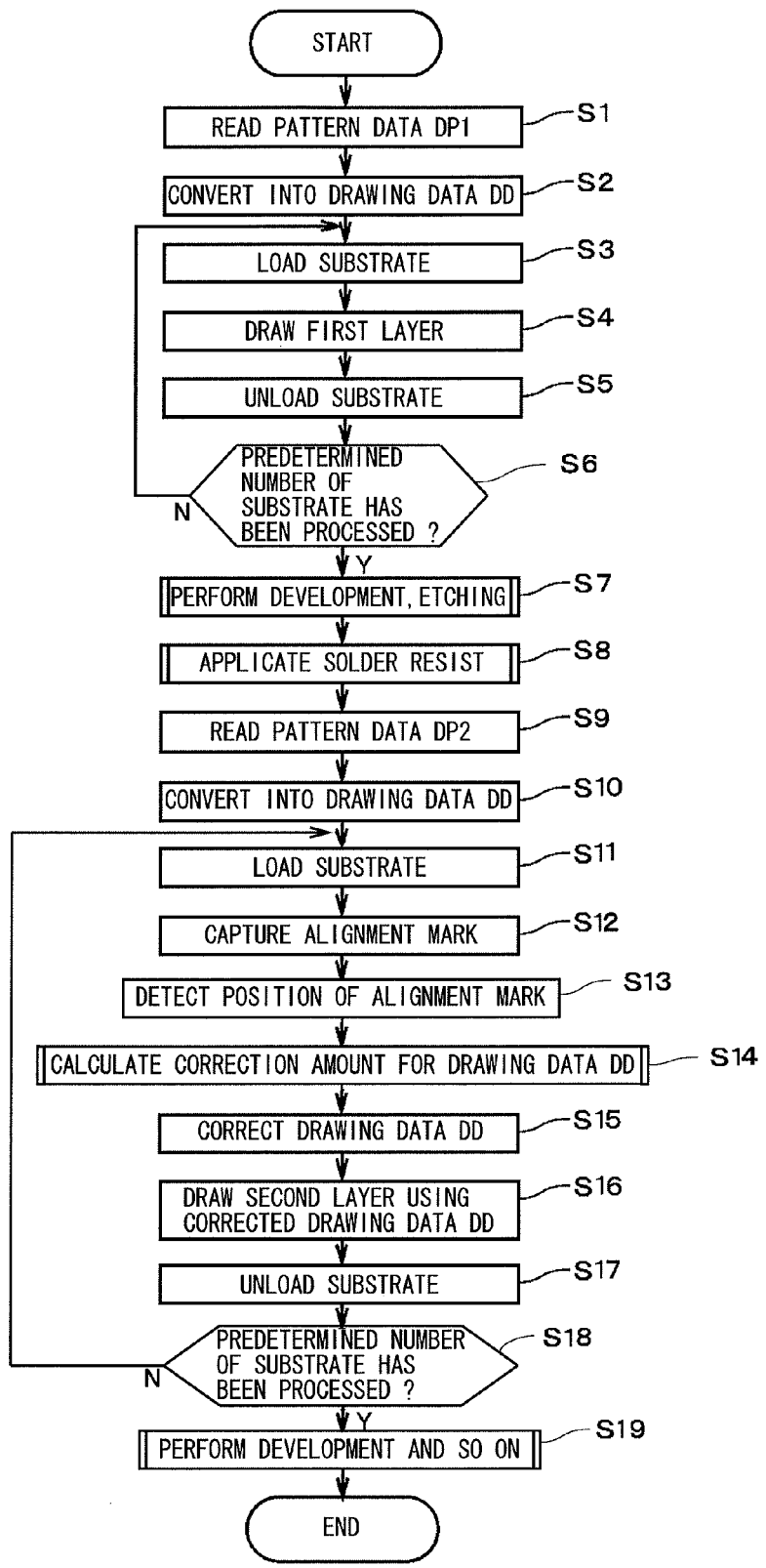
FIG. 3 is a flowchart showing an overview of a method for manufacturing a printed board.

The following is a description of an overview of a method for manufacturing a printed board by drawing a circuit pattern on the board according to the present invention. It is assumed here that a copper wiring pattern is formed on a single-side printed wiring board having a resin base, and a solder resist pattern is formed thereon. FIG. 3 is a flowchart showing an overview of the entire control program for this method executed by the data processor 2 (including an overview of operations performed by the data processor 2).

Pattern Formation of First Layer

First, the pattern design apparatus 4, in advance, designs a copper wiring pattern of a printed board to be created and a solder resist pattern to be formed on the copper wiring pattern and stores data of the copper wiring pattern as pattern data DP1 of the first layer and data of the solder resist pattern as pattern data DP2 of the second layer in a storage device (not shown) provided in the pattern design apparatus 4. At this time, the pattern data DP1 of the first layer additionally includes, in consideration of X and Y coordinates on the surface of the substrate S, an array of cross-shaped alignment marks Ma that are spaced from one another at a predetermined interval in both X and Y directions, with at least four alignment marks in each direction, giving a total of at least 16 alignment marks.

First, the created pattern data DP1 is transmitted to the data processor 2, and read by the data processor 2 (step S1). The data processor 2 converts the read pattern data DP1 into initial drawing data D1, which is data in a raster format that can be processed by the exposure device 3, and transmits (inputs) this initial drawing data D1 as is as drawing data DD to the drawing controller 31 of the exposure device 3 (step S2). That is, since the first layer is being drawn, there is no pattern formed on the substrate S prior to the exposure performed in accordance with the initial drawing data D1, and accordingly there is no deformation or the like. Thus, data correction is not necessary and thus not performed, and the initial drawing data D1 of the pattern data DP1 is used as is as the drawing data DD. Note that the conversion into a raster format may be performed using a known technique.

When the drawing data DD has been transmitted to the exposure device 3, a substrate S targeted for drawing is conveyed to the exposure device 3 and positioned and fixed to the stage 32 (step S3). The substrate S is a printed board with a copper layer formed on one surface side of its resin base. When the substrate S is conveyed to the exposure device 3, a photoresist film has already been formed on the copper layer in order to pattern the copper layer. Note that the conveyance of the substrate S to and out of the exposure device 3 (described later) may be performed by a transport apparatus (not shown) in accordance with an instruction from the drawing controller 31, or may be manually performed by an operator.

When the substrate S has been conveyed to the exposure device 3, the drawing controller 31 controls the modulation part 33a of the light source 33, the stage 32, and so on and performs drawing processing by emitting the laser light LB modulated in accordance with the initial drawing data D1, thereby patterning the substrate S (step S4). Specifically, photosensed portions based on the initial drawing data Dl are formed in the photoresist formed on the surface of the substrate S.

When the drawing processing using the initial drawing data D1 has ended, the substrate S is conveyed out of the exposure device 3 (step S5). If multiple substrates S are to be processed in the same manner, the number of substrates processed is counted and a determination is made as to whether a predetermined number of substrates has been processed (step S6). If the predetermined number of substrates has not been processed, the procedure returns to step S2. If the predetermined number of substrates has been processed, the procedure proceeds to step S7.

The substrate S that has undergone the drawing processing performed by the exposure device 3 is conveyed to a development apparatus (not shown) where development, etching, and other processing such as washing and heat treatment that accompanies development and etching are performed (step S7). When step S7 has ended, the copper layer on the surface of the substrate S has been patterned to form a predetermined wiring pattern. This ends the pattern formation of the first layer.

Pattern Formation of Second Layer

Next, a second layer is patterned on the substrate S. First, the substrate S on which the predetermined wiring pattern has been formed in step S7 is conveyed to a film forming apparatus (not shown), where a solder resist film is formed over the entire surface of the substrate S by a method such as application or lamination (step S8)

Meanwhile, the data of the solder resist pattern (the pattern data DP2 of the second layer) created by the pattern design apparatus 4 in step S1 is transmitted from the pattern design apparatus 4 to the data processor 2 and read by the data processor 2 (step S9). The data processor 2 converts the read data into initial drawing data D2 that is data in a raster format that can be processed by the exposure device 3. This initial drawing data D2 is not immediately transmitted to the drawing controller 31 of the drawing apparatus 1, but instead is stored in an internal storage device (not shown) of the data processor 2 for subsequent correction described later (step S10). In other words, the initial drawing data D2 is received by a reception part 210 to be prepared.

The substrate S on which the solder resist layer has been formed in step S8 is again conveyed to the drawing apparatus 1 and positioned and fixed to the stage 32 in the same manner as in step S3 (step S11).

Next, an image of the substrate S fixed to the stage 32 is captured by the image pickup part 34, and the captured image is transmitted as the captured mark data DM to the data processor 2 via the drawing controller 31 (step S12). Specifically, in the present embodiment, although the image pickup part 34 captures an image of the entire photosensitive film surface (drawing surface) of the substrate S that faces upward, as described later, this is in order to detect the positions of the alignment marks M formed on the drawing surface of the substrate S, and therefore it is not necessarily required to capture the entire image of the substrate S as long as it is possible to capture an image of necessary alignment marks M.

A position calculation part 211 of the data processor 2 recognizes and extracts all of the alignment marks M formed on the surface of the substrate S by processing the received captured mark data DM, and detects the positions of the alignment marks M (step S13). Through this, position information of the multiple alignment marks M is calculated. Since the substrate S is positioned and fixed to the stage 32 in the same manner as in drawing (step S3), if the substrate S is neither deformed nor distorted, the alignment marks M will be detected at the same positions in the exposure device 3 as they were at the time of drawing, but in actuality, it is often the case that deformation or distortion occurs in the substrate S due to processing performed after drawing, such as development or etching, and some or all of the alignment marks M are detected at shifted positions.

Subsequently, the data processor 2 calculates correction amounts for the initial drawing data D2 to be used for the next exposure, in correspondence with shifts in the positions of the alignment marks M such as deformation or distortion of the substrate S (step S14), and a drawing data correction part 219 performs correction processing using the calculated correction amounts and obtains corrected drawing data DD (step S15). Though this correction processing, the initial drawing data D2 to be used for subsequent drawing is corrected in correspondence with deformation or distortion of the surface of the substrate S on which the copper wiring pattern has been previously formed in accordance with the initial drawing data D1, and subsequent drawing is performed in accordance with the corrected drawing data DD. This eliminates or reduces shifts in the positional relationship between the previously formed copper wiring pattern and the currently formed solder resist pattern. Thus, satisfactory drawing quality and manufacturing quality are achieved. Note that the correction processing including step S14 will be described in detail later.

Next, the data processor 2 transmits the corrected drawing data DD obtained in step S15 to the drawing controller 31 of the exposure device 3, and the drawing controller 31 controls the modulation part 33a of the light source 33, the stage 32, and so on and performs drawing processing by emitting the laser light LB modulated in accordance with the drawing data DD, thereby patterning the substrate S (step S16). Specifically, photosensed portions based on the drawing data DD are formed in the solder resist formed on the surface of the substrate S.

When the drawing processing using the drawing data DD (or based on the drawing data DD) has ended, the substrate S is conveyed out of the exposure device 3 (step S17). If multiple substrates S are to be processed in the same manner, the number of substrates processed is counted and a determination is made as to whether a predetermined number of substrates has been processed (step S18). If the predetermined number of substrates has not been processed, the procedure returns to step S11. If the predetermined number of substrates has been processed, the procedure proceeds to step S19.

The substrate S that has undergone the drawing processing performed by the exposure device 3 is conveyed to a development apparatus or the like (not shown), where processing such as development that is necessary for pattern formation is performed on the substrate S (step S19). When this step S19 has ended, the solder resist on the copper layer formed on the surface of the substrate S has been patterned to form a predetermined solder resist pattern. This ends the pattern formation of the second layer.

Overview of Correction Processing

Figure 4:
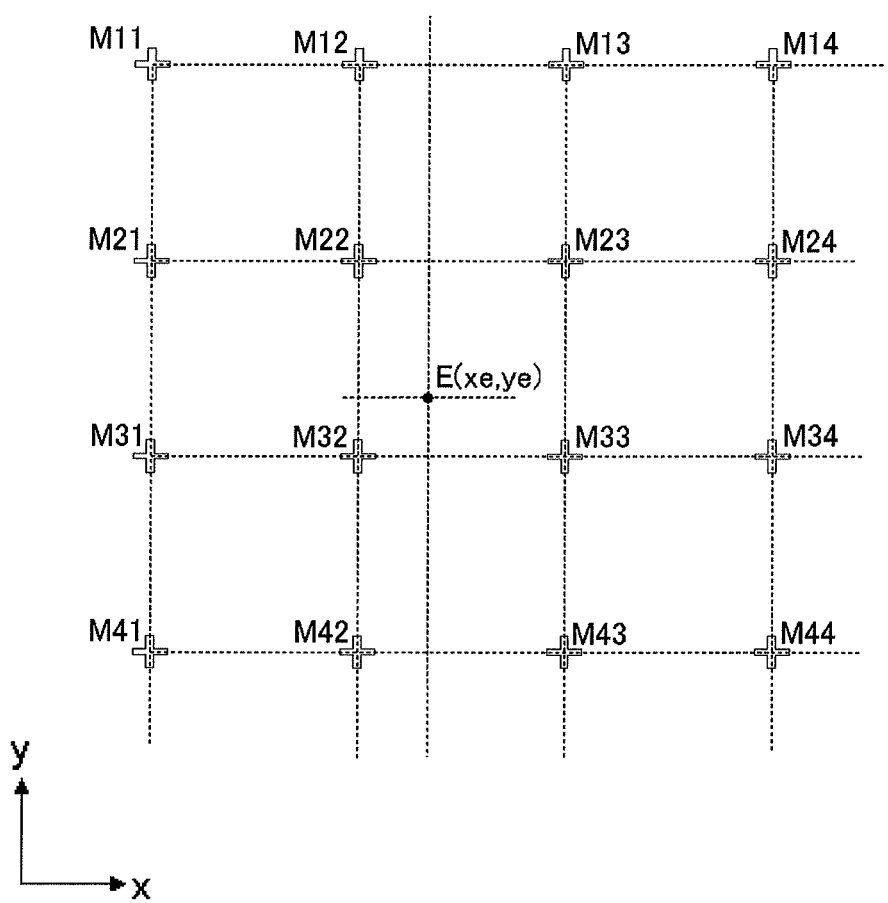
FIG. 4 is a diagram showing the arrangement of alignment marks M and an image element E.

Next is a description of an overview of processing for calculating correction amounts for the initial drawing data D2 performed in step S14 described above according to the present invention. FIG. 4 shows the arrangement of alignment marks M in the pattern data DP1 and the design position of an image element E that is included in the pattern data DP2 corresponding to that part of the pattern data DP1 (hereinafter, the image element E is referred to as a "correction source" and its coordinates are defined as (xe, ye)). Open cross-shaped alignment marks M11, M12, M13, . . . , M21, M22, M23, and so on in the figure are arranged in a grid matrix in an XY plane (hereinafter, they are collectively referred to as "alignment marks M"). FIG. 4 shows only part of the array, i.e., a 4-row by 4-column portion.

It is assumed here that correction is made to the position where to draw the image element E on the substrate S in the case where the positions of the alignment marks M detected in steps S12 and S13 illustrated in FIG. 3 are shifted from their respective positions drawn in step S4 due to distortion of the substrate S. In this case, the image element E is a target point E to be evaluated, and the amounts of shift of a total of 16 alignment marks including four alignment marks M22, M23, M32, and M33 surrounding the image element E and further 12 alignment marks surrounding these four alignment marks (namely, the alignment marks M11 to M14, M21 to M24, M31 to M34, and M41 to M44) are used for the calculation of correction amounts in the position correction. Alignment marks located in the vicinity of the image element E can be used for the calculation of correction amounts.

The process of calculating correction amounts in the position correction of the image element E is roughly divided into the following steps:

(1) Acquiring the position of a shift destination and the amount of shift from the original position for each alignment mark M;

(2) Calculating a correction amount of the target point in the X direction; and (3) Calculating a correction amount of the target point in the Y direction.

Details of Processing for Calculating Correction Amounts

Figure 13:
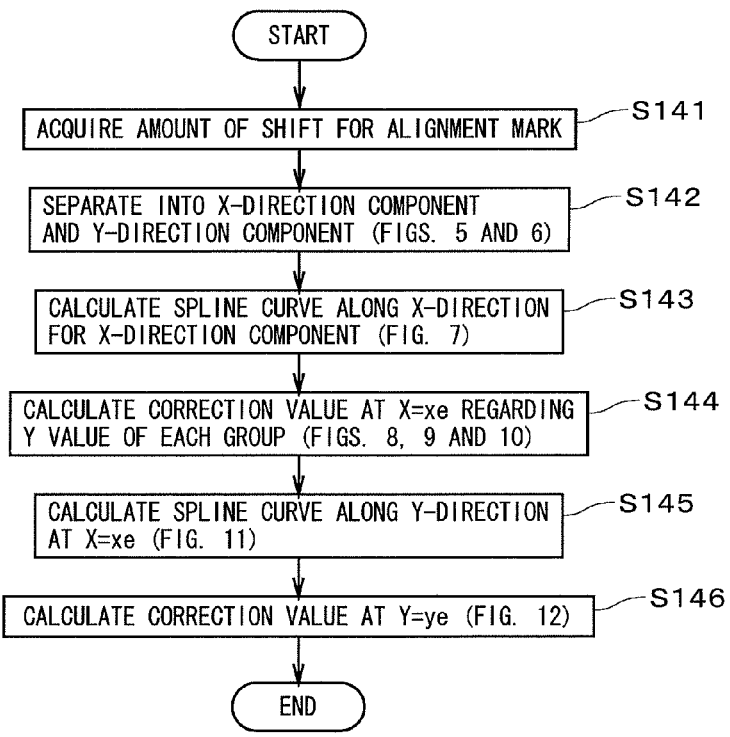
FIG. 13 is a flowchart illustrating details of the calculation of correction amounts performed in step S14.

The following is a detailed description of the steps. FIG. 13 is a flowchart showing the details of step S14.

Figure 5:
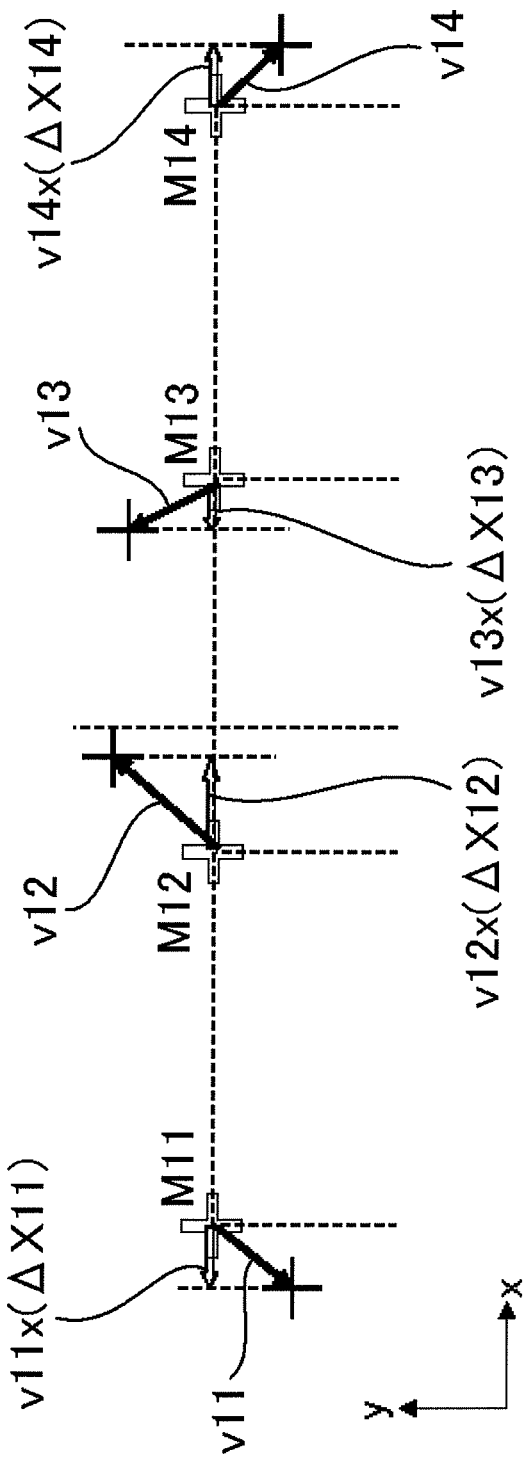
FIG. 5 is a diagram showing displacements of the alignment marks M and X-direction components of the displacements.

(1) First, the position of a shift destination and the amount of shift from the original position is acquired for each alignment mark M (step S141). In the present example, the amounts of shift of the alignment marks M11 to M14 are calculated by processing the captured image of these alignment marks. It is assumed that the alignment marks M11 to M14 detected in steps S12 and S13 are shifted to the positions indicated by black cross marks in FIG. 5. Now consider a vector from the original position to the position of a shift destination for the alignment mark M11. In this case, a vector to the portion of the shift destination is v11 in FIG. 5. This vector v11 indicates the amount of shift from the original position. The vectors for the other alignment marks M12 to M14, M21 to M24, M31 to M34, and M41 to M44 are obtained in the same manner. In actuality, a displacement detection part 212 obtains the vectors described above based on the position information calculated by the position calculation part 211. The vector described above indicates the amounts of shift in X and Y directions.

The step (2) is composed of the following sub-steps.

(2-1) A separation part 213 separates the amount of shift (displacement) in the position of each of the alignment marks M11 to M14 into an X-axis component and a Y-axis component, and calculates the amount of shift ΔX in the X direction (step S142). When the vector v11 of the alignment mark M11 is divided into an X-direction component and a Y-direction component, the X-direction component is v11$x$ in FIG. 5. This is the amount of shift ΔX11 of the alignment mark M11 in the X direction. The amounts of shift ΔX12, ΔX13, and ΔX14 of the other alignment marks M12 to M14 are obtained in the same manner.

Figure 6:
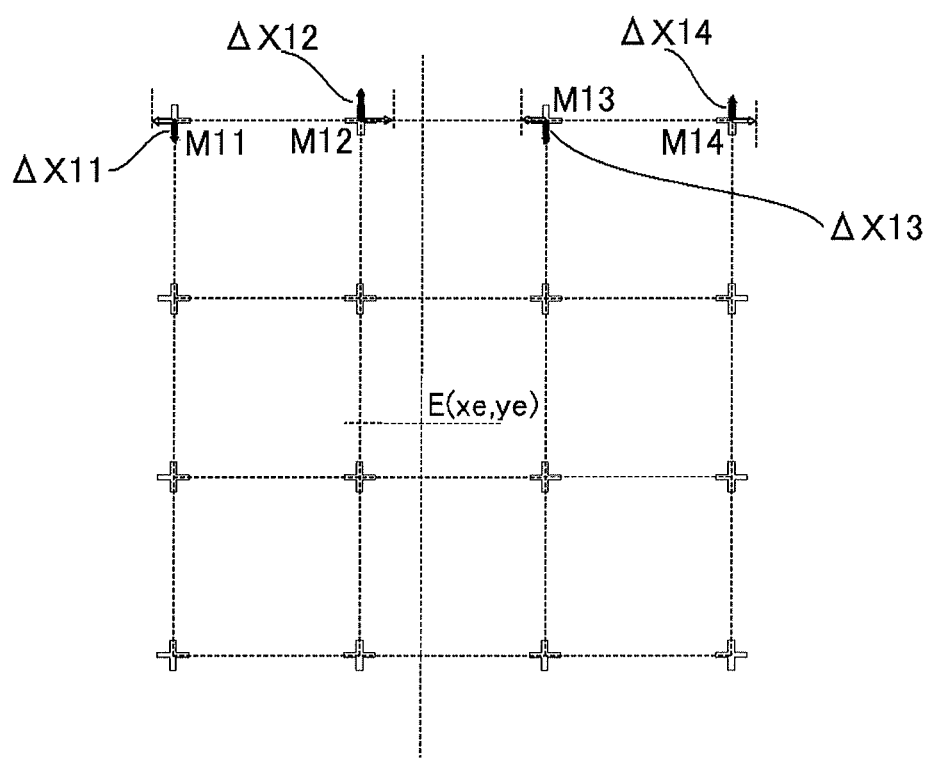
FIG. 6 is a diagram in which the X-direction displacement components of the alignment marks M are taken on the vertical axis.

(2-2) The amounts of shift ΔX of the alignment marks M11 to M14 in the X direction are taken on the vertical axis at respective positions of the alignment marks M11 to M14. In the present example, as shown in FIG. 6, the amount of shift ΔX11 of the alignment mark M11 in the X direction is taken on the vertical axis. This means that the X-direction component v11$x$ of the vector vii is directed along the vertical axis. Similarly, the amounts of shift ΔX12, ΔX13, and ΔX14 of the other alignment marks M12 to M14 are taken on the vertical axis.

Figure 7:
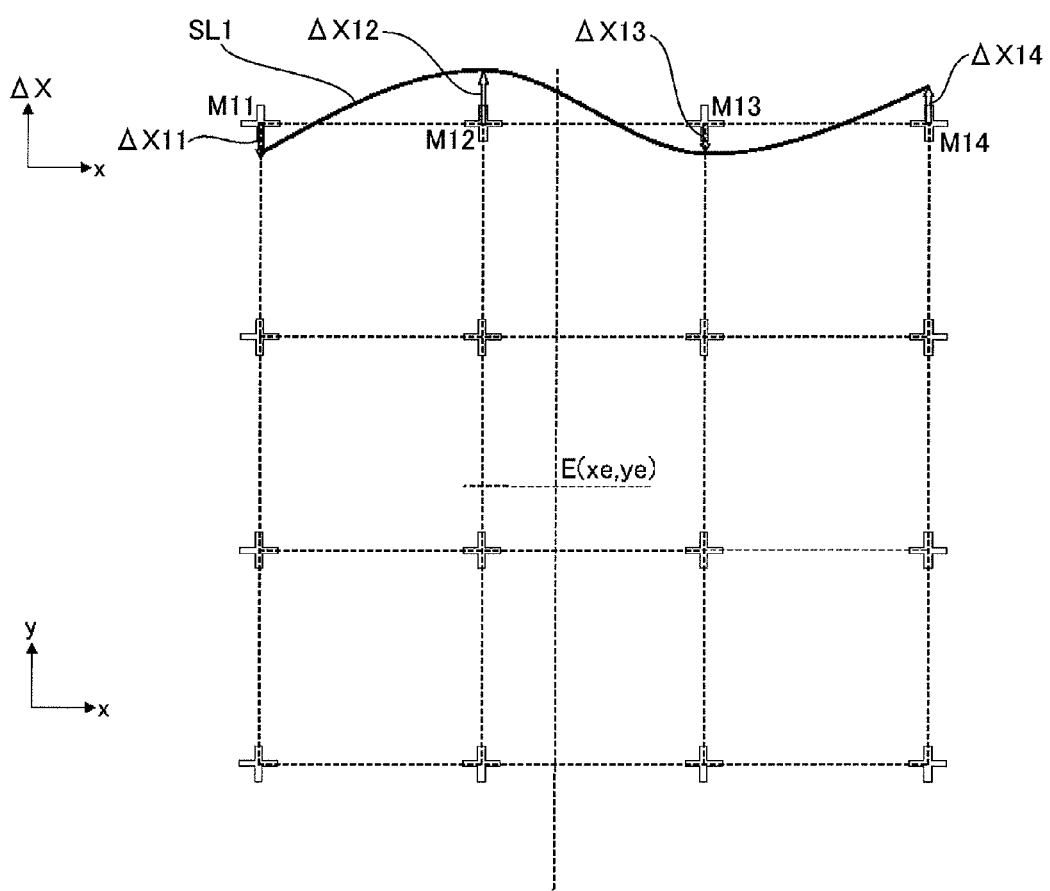
FIG. 7 is a diagram showing a first spline curve that indicates the relationship between the X-direction displacement components and X-axis values of the alignment marks M.

(2-3) A spline calculation part 215 in a target-point displacement calculation part 214 creates a horizontal (X-direction) spline curve SL1 (i.e., spline curve along the X-direction) between the alignment marks M11 to M14 for the X-axis amounts (ΔX) of the shift destinations of these alignment marks taken on the vertical axis (step S143). In the present example, as shown in FIG. 7, the points indicating the X-axis amounts (ΔX) of the shift destinations of the alignment marks M11 to M14 taken on the vertical axis are connected by a gentle horizontal curve, i.e., the spline curve SL1. This is represented by, for example, a cubic equation passing through these four points. That is, this step calculates, for a group of the alignment marks M11 to M14 that are aligned in the X axis direction and have the same Y-axis value, the first spline curve SL1 that indicates the relationship between the X-axis direction displacement values and the X-axis values of the alignment marks M11 to M14.

Figure 8:
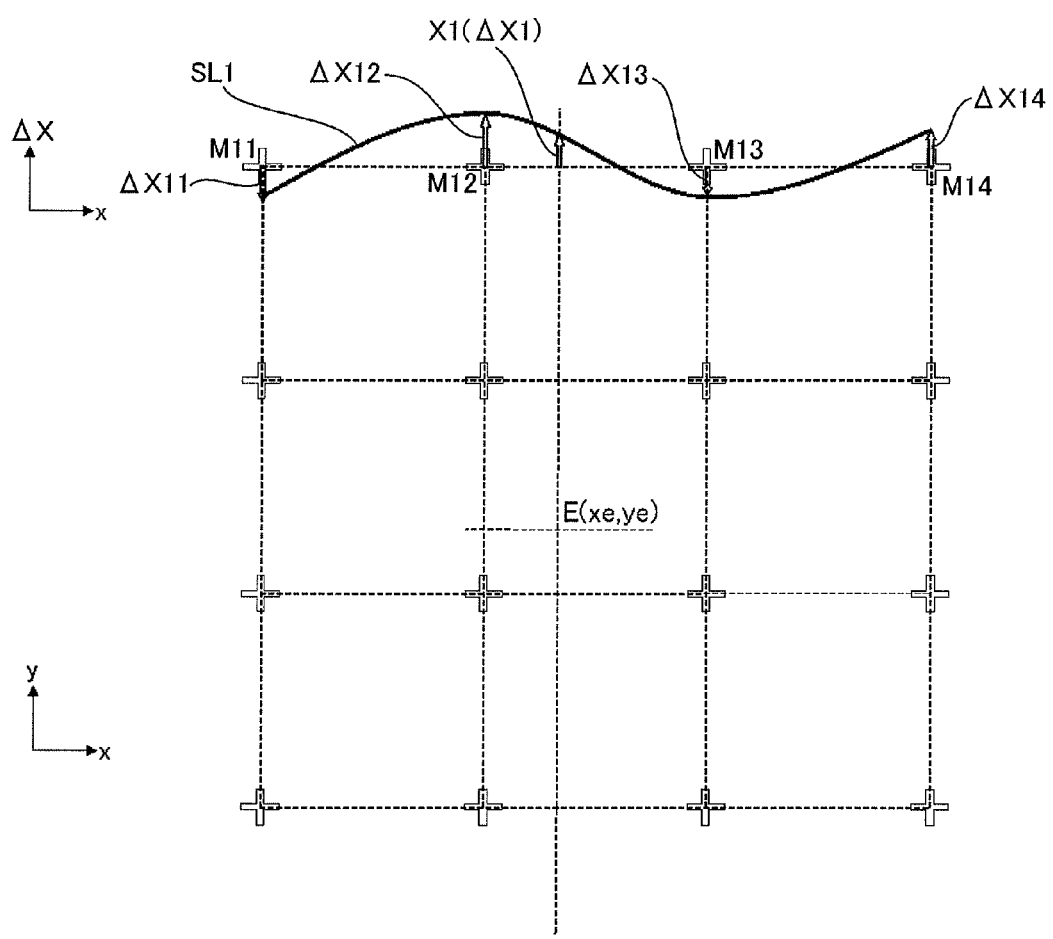
FIG. 8 is a diagram illustrating the step of calculating a displacement value X1 at the X-axis value (X=xe) of a target point E, based on the first spline curve.

(2-4) A spline-indicated-value calculation part 216 calculates a correction value ΔX1 indicated by the plotted spline curve SL1 at an X position (X=xe) of the correction source E (xe, ye) (step S144). In the present example, as shown in FIG. 8, ΔX1 is the distance on the line of the X position (xe) from the straight line of the Y position which connects the alignment marks M11 to M14 to the spline curve SL1 previously plotted in sub-step (2-3). This distance is the magnitude of a vector X1 in FIG. 8 and denotes the correction value at the point X=xe on the straight line connecting the alignment marks M11 to M14. That is, this step calculates a displacement value at the X-axis value (X=xe) of the target point E (xe, ye) based on the first spline curve SL1.

Figure 9:
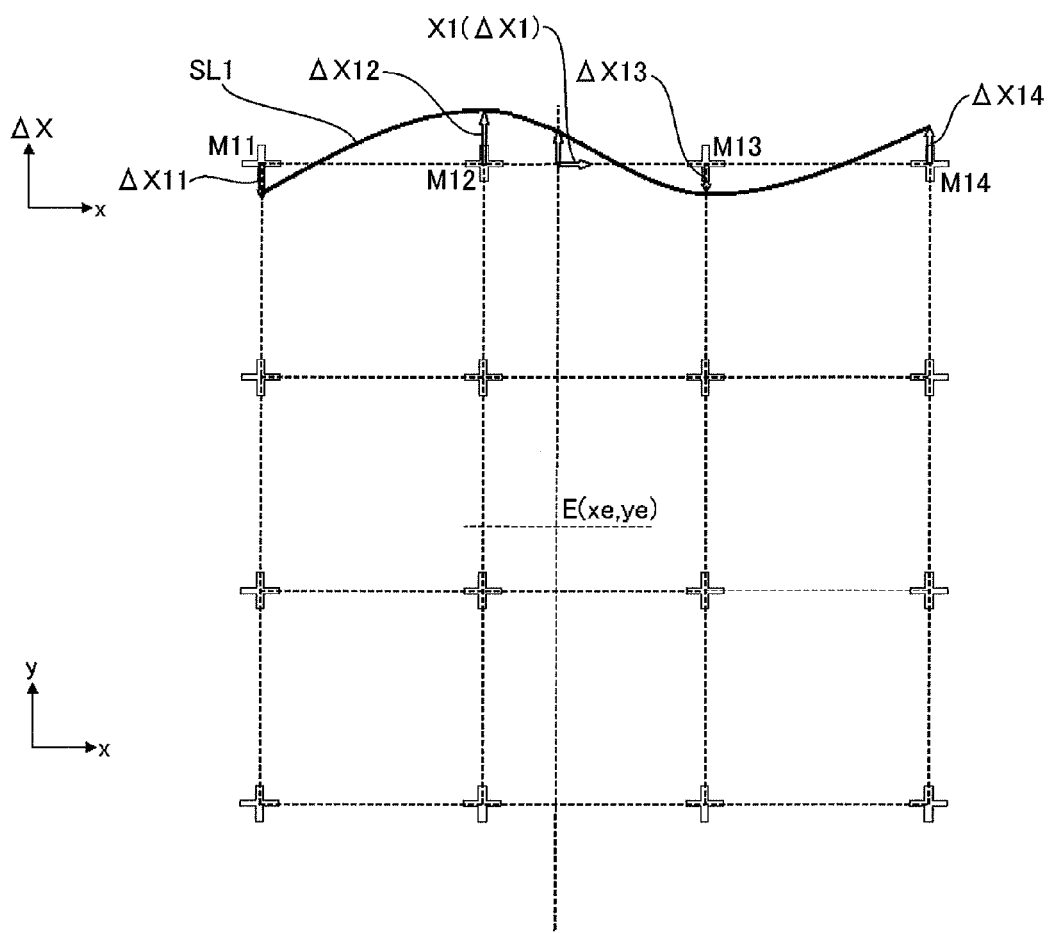
FIG. 9 is a diagram in which the calculated displacement value ΔX1 at the X-axis value (X=xe) of the target point E is taken on the horizontal axis.

(2-5) The calculated correction value ΔX1 is generated on the horizontal axis at the Y position of the alignment marks M11 to M14 at the X position (X=xe). In the present example, as shown in FIG. 9, the correction value ΔX1 is taken on the horizontal axis from the line of the X position (X=xe) at the Y position of the alignment marks M11 to M14. This is equivalent to orienting the vector X1 in FIG. 8 along the horizontal axis from the line of the X position (X=xe).

Figure 10:
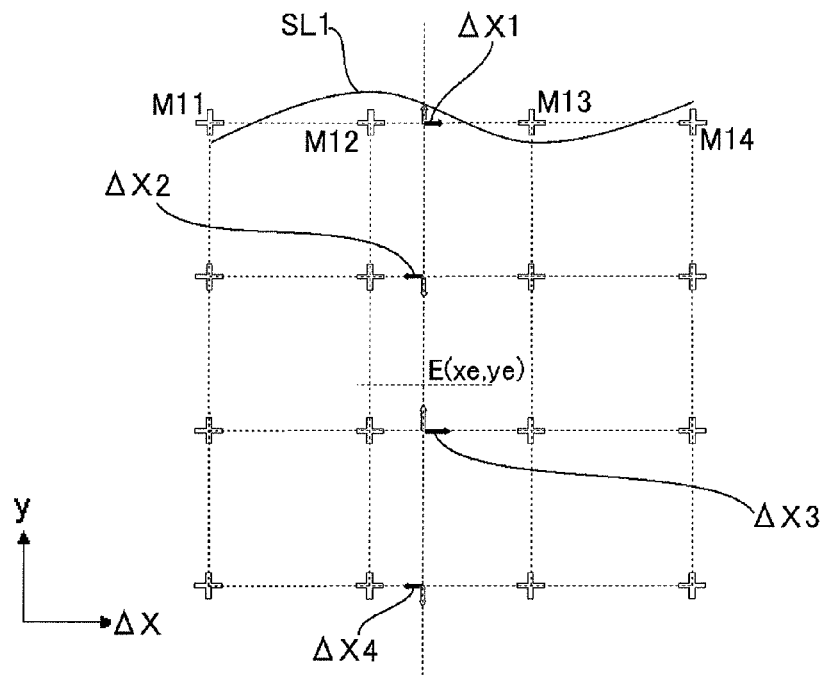
FIG. 10 is a diagram in which displacement values ΔX2, ΔX3, and ΔX4 calculated at the X-axis value (X=xe) of the target point E for the other groups of alignment marks are taken on the horizontal axis.

(2-6) For the alignment marks M21 to M24, M31 to M34, and M41 to M44, correction values ΔX2, ΔX3, and ΔX4 at the X position (X=xe) are also calculated in the same manner as sub-steps (2-2) to (2-5) described above, and the calculated correction values are taken on the horizontal axes at the Y positions of the respective alignment marks at the X position (xe). In the present example, as shown in FIG. 10, the correction values ΔX2, ΔX3, and ΔX4 at the X position (X=xe) are also similarly calculated for the alignment marks M21 to M24, M31 to M34, and M41 to M44, and the calculated correction values are taken on the horizontal axes at the Y positions of the respective alignment marks at the X position (X=xe). Note that this processing is the same as that performed in sub-steps (2-2) to (2-5) described above, and is therefore included in steps S142 to S144 in FIG. 13.

Figure 11:
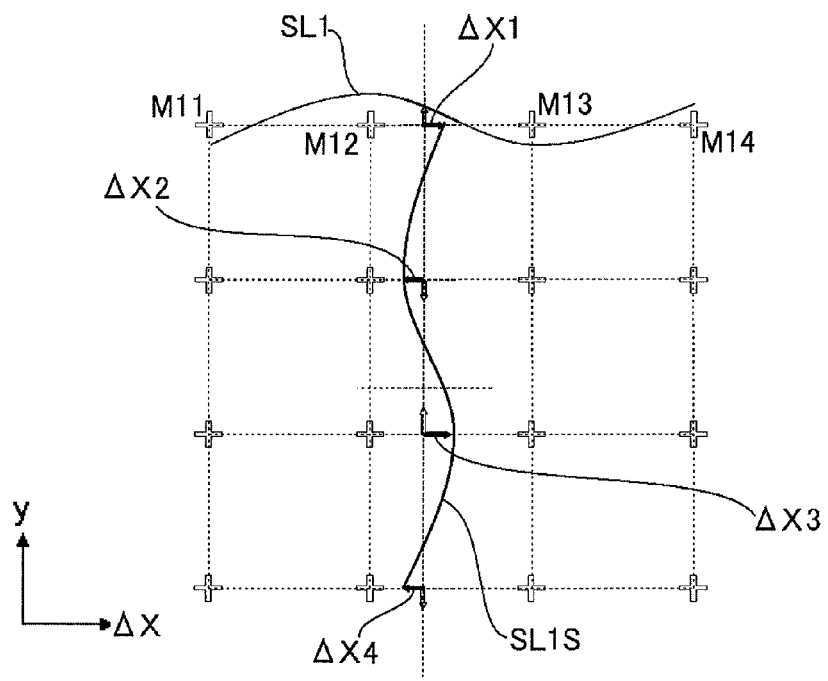
FIG. 11 is a diagram showing a first sub-spline curve that indicates the relationship between the displacement values calculated based on the first spline curve, and Y-axis values.

(2-7) A sub-spline calculation part 217 creates a vertical (Y-direction) spline curve SL1S (i.e., spline curve along the X-direction) for the plotted correction values ΔX1, ΔX2, ΔX3, and ΔX4 (step S145). In the present example, as shown in FIG. 11, the spline curve SL1S for the positions indicated by the correction values ΔX1, ΔX2, ΔX3, and ΔX4 is created in the same manner as in sub-step (2-3). That is, this step calculates the first sub-spline curve SL1S that indicates the relationship between the displacement values of respective groups of the alignment marks at the X position (X=xe), which have been calculated based on the first spline curves SL1 generated for the groups, and the Y-axis values of the respective groups.

Figure 12:
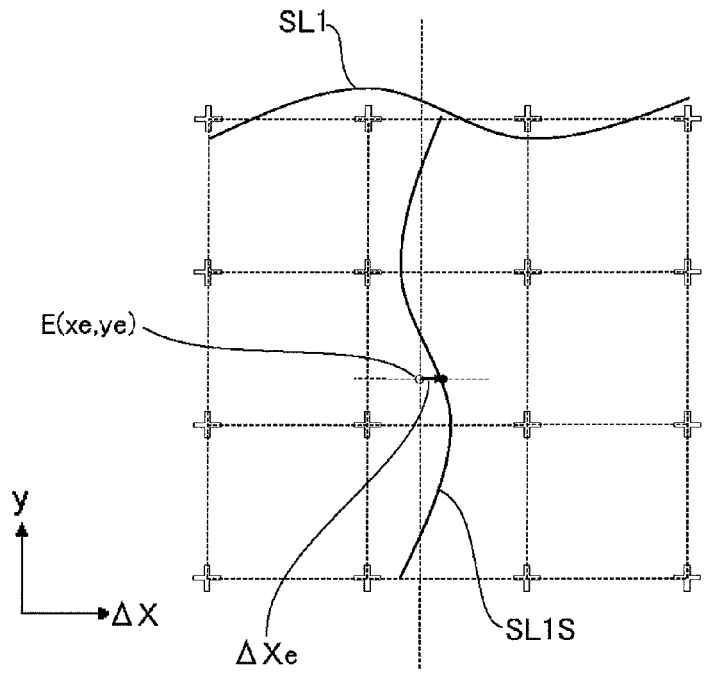
FIG. 12 is a diagram illustrating the step of calculating a displacement value ΔXe at the Y-axis value (Y=ye) of the target point E, based on the first sub-spline curve.

(2-8) A sub-spline-indicated-value calculation part 218 calculates a value ΔXe indicated by the plotted spline curve SL at the Y position (Y=ye) of the correction source E (xe, ye) (step S146). In the present example, as shown in FIG. 12, the value ΔXe indicated by the spline curve SL1S plotted in sub-step (2-7) and the Y position (Y=ye) of the correction source E (xe, ye) is calculated. That is, this step calculates a displacement value at the Y-axis value (Y=ye) of the target point E (xe, ye) based on the calculated first sub-spline curve SL1S. This is, in other words, the displacement value of the target point E (xe, ye), and so the value ΔXe is defined as the correction amount of the correction source E (xe, ye) in the X direction. As described above, in sub-steps (2-2) to (2-6) described above, a spline curve is calculated that indicates the relationship between the displacement values of reference points included in each group and the values of the reference points in one coordinate axis where the reference points included in the each group is aligned along the direction of the one coordinate axis and have the same value (same original value) in the other coordinate axis, and then the values indicated by the spline curves of the respective groups at the value of the target point in the one coordinate axis are calculated as spline-indicated values. Furthermore, in sub-steps (2-7) and (2-8) described above, a sub-spline curve is calculated that indicates the relationship between the spline-indicated values of the respective groups and the values of the respective groups in the other coordinate axis, and then the value indicated by the sub-spline curve at the value of the target point in the other coordinate axis is calculated.

In step (3), the same procedure as in step (2) is performed for the Y direction, and a correction amount ΔYe of the correction source E (xe, ye) in the Y direction is calculated. Note that step (3) is the same as step (2), and therefore the description thereof is omitted in FIG. 13. As described above, steps (2) and (3) correspond primarily to the computation of displacement of a target point performed by the target-point displacement calculation part 214.

Ultimately, using the calculated correction amounts ΔXe and ΔYe of the correction source E (xe, ye), the corrected position where to draw the correction source E, i.e., the image element E (xe, ye), is determined as (xe+ΔXe, ye+ΔYe). Then, the drawing data DD is generated from the pattern data DP2 based on these coordinates. That is, the drawing data DD is created by displacing the position of a pixel to be drawn at a target point in the initial drawing data based on the displacement of that target point. Note that in the embodiment described above, steps S13 to S15 are executed by the drawing data correction unit 21 that corrects drawing data.

Modifications

In the embodiment described above, the correction amount in the X direction is calculated by first plotting the X-direction spline curve SL1 for the alignment marks M11 to M14, then similarly plotting the X-direction spline curves SL1 for the alignment marks M21 to M24, M31 to M34, and M41 to M44, and then creating the vertical (Y-direction) spline curve SL1S for the correction values ΔX1, ΔX2, ΔX3, and ΔX4, but the vertical (Y-direction) spline curve may be plotted in the first place. Specifically, the amounts of shift ΔX of the alignment marks M11 to M41 in the X direction may be plotted in the lateral direction (the X direction) so as to plot a spline curve in the Y direction. By repeating this operation for the alignment marks M12 to M42, M13 to M43, and M14 to M44, the correction amount ΔXe can be calculated by plotting the calculated correction values ΔX1, ΔX2, ΔX3, and ΔX4 on the vertical (Y) axes and then plotting a horizontal (X-direction) spline curves for these correction values taken on the vertical axes. Alternatively, both of the above computations may be performed and an average value of the correction amounts ΔXe calculated through these computations may be obtained. The same applies to the calculation of the correction amount ΔYe in the Y direction.

Furthermore, in the embodiment described above, the correction amount in the X direction is calculated by first plotting the X-direction spline curve SL1 and then creating the vertical (Y-direction) spline curve SL1S, and the correction amount in the Y direction is also calculated in the same manner, but a method that is different from that used to calculate the correction amount in the X direction may be used to calculate the correction amount in the Y direction. Specifically, the correction amount in the Y direction may be calculated by first plotting a Y-direction spline curve and then creating a horizontal (X-direction) spline curve. Conversely, the correction amount in the X direction may be calculated by first plotting a Y-direction spline curve and then creating a horizontal (X-direction) spline curve, and the correction amount in the Y direction may be calculated by first plotting an X-direction spline curve and then creating a vertical (Y-direction) spline curve.

Furthermore, in the embodiment described above, 16 alignment marks around the correction source E are used to calculate the correction amounts, but in the case where it is difficult to get a 4-row by 4-column group of 16 alignment marks around a correction source, such as in the case where the correction source is at a corner of the drawing area indicated by the pattern data DP2, a 3-row by 3-column group of alignment marks, for example, may be used to plot spline curves. Note that plotting spline curves in the above description does not necessarily mean only creating plots, but rather means calculating corresponding equations from the coordinates on the curves.

Furthermore, alignment marks are not limited to those being arranged in a square grid, but may be arranged in a rectangular grid, for example. Also, alignment marks do not need to be spaced at equal intervals and do not necessarily be arranged in a grid matrix, but at least need to be aligned in a straight line in one direction so as to be used as reference points. If there are no appropriate alignment marks aligned in a straight line, it is sufficient to calculate points such as to be located on a straight line by interpolation using neighboring alignment marks and use these points as reference points. Conceivable methods of this interpolation include, for example, a method of measuring the distances from a point such as described above to three alignment marks in the vicinity of that point and the amounts of displacement of these three alignment marks in both the X and Y directions, and interpolating the amounts of displacement of that point by inverse distance weighted interpolation. As described above, it is sufficient for multiple reference points to be substantially located along the directions of first and second coordinate axes that intersect each other.

Note that in the drawing apparatus according to the present invention, as the target-point displacement calculation part that calculates a displacement in the position of a target point in accordance with the displacement values detected by the displacement detection part, dedicated software or hardware may be prepared for both cases where an X-direction spline curve is plotted first and thereafter a Y-direction spline curve is created as in the embodiment described above and where a Y-direction spline curve is plotted first and thereafter an X-direction spline curve is created. However, common software or hardware may be used instead in both cases because the difference is only in the coordinate axes.

Effects

As described thus far, according to the present invention, for example even if a substrate undergoes non-local distortion, such as in the case where the entire substrate is distorted in an undulating manner, it is possible to perceive the tendency of such distortion over a wide area of the substrate and accurately calculate displacements of the substrate, using spline curves created from displacements of multiple reference points and to properly correct drawing data based on the calculated displacements. It is also possible to properly perform drawing based on the calculated drawing data.

Figure 14:
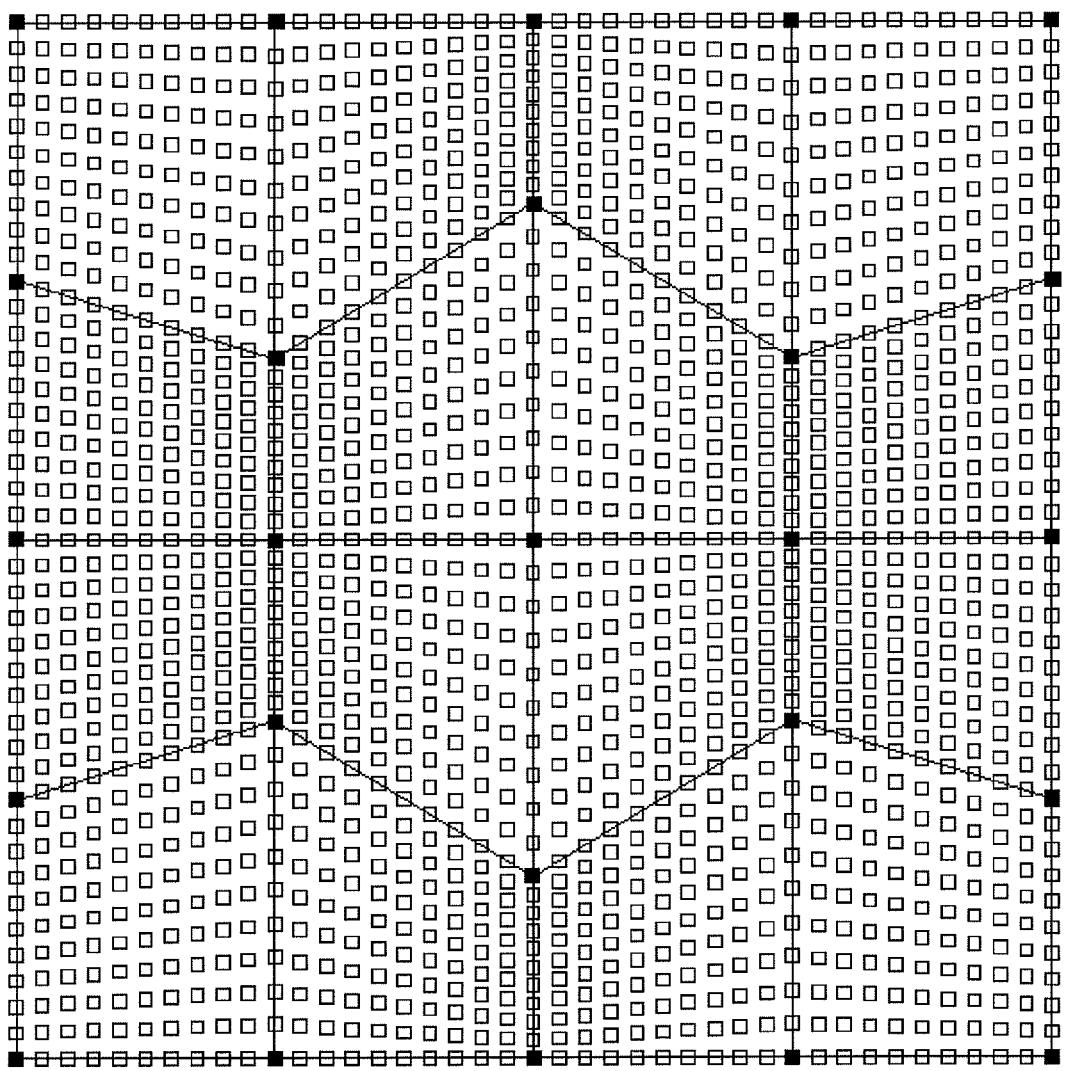
FIG. 14 is a diagram showing an example of correction results obtained with a conventional method.
Figure 15:
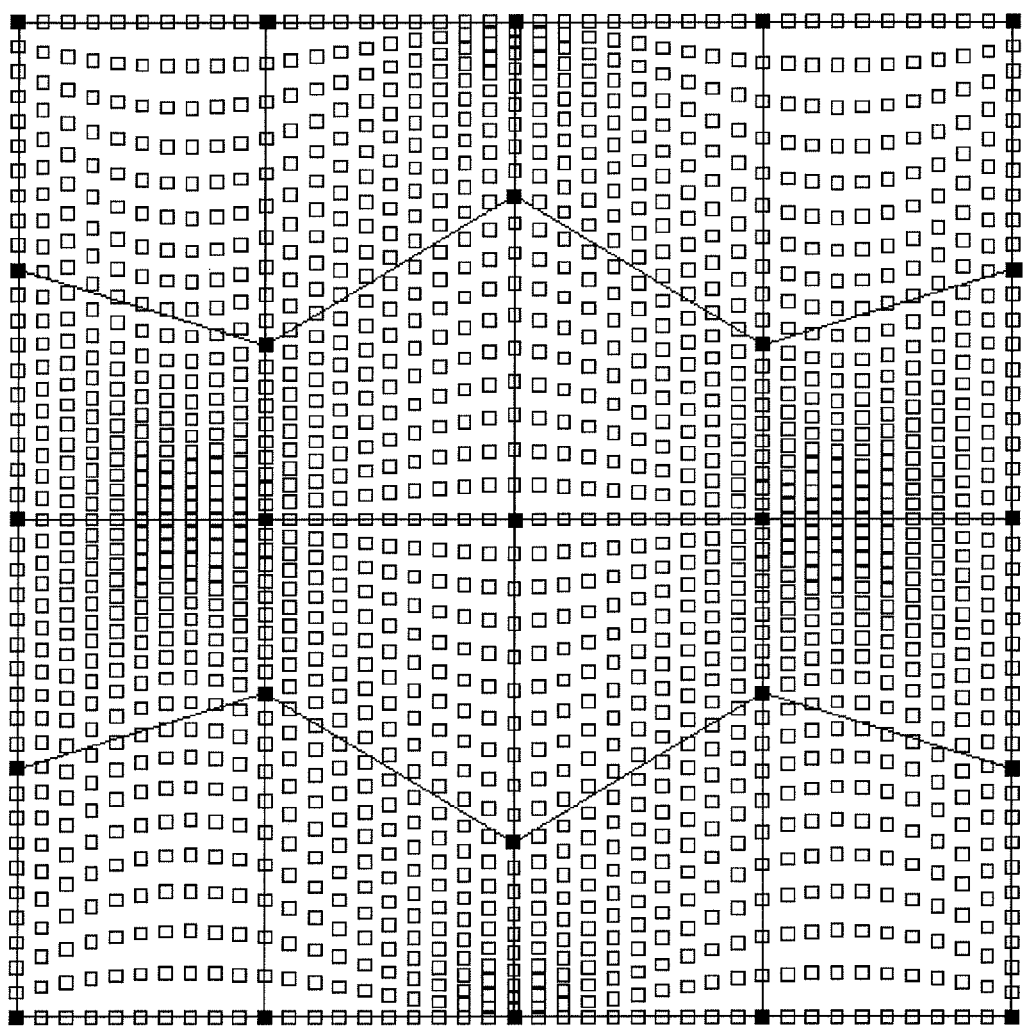
FIG. 15 is a diagram showing an example of correction results obtained with the present invention.

FIGS. 14 and 15 show examples of correction results of the pattern data DP1, FIG. 14 showing the case using a conventional method called bi-linear interpolation, and FIG. 15 showing the case using the displacement calculation method and the correction method of the present invention. In these examples, the same pattern data DP1 is used, in which small open squares are target points that are arranged in a square grid. Small black squares are alignment marks serving as reference points, and they are arranged in a 5-by-5 square grid. Both examples show the correction results of all target points in the case where a total of 15 alignment marks including five alignment marks arranged in the top line in the horizontal direction, five alignment marks arranged in the bottom line in the horizontal direction, and five alignment marks arranged in the middle line in the horizontal direction have not moved, whereas the remaining 10 alignment marks have moved upward or downward in an undulating manner. Whereas with the conventional method, the target points in the vicinity of the alignment marks that have moved are angularly arrayed, with the present invention the corresponding target points are smoothly arrayed reflecting the spline curves, and therefore it is considered that more precise correction has been made for distortion of a substrate or the like such as substrate undulation.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2010-220717 filed in the Japan Patent Office on Sep. 30, 2010, the entire disclosure of which is incorporated herein by reference.

Reference Signs List

1 Drawing apparatus
2 Data processor
3 Exposure device
21 Drawing data correction unit
33 Light source
33a Modulation part
34 Image pickup part
M11, M12, M13, . . . , M44 Alignment mark
E Target point
SL1 First spline curve
SL1S First sub-spline curve

The invention claimed is:

1. A displacement calculation method for calculating a displacement of a target point based on displacements of a plurality of reference points arranged in a grid on a surface of a substrate, along a first coordinate axis direction and a second coordinate axis direction that intersect each other, the method comprising:
   a step of obtaining position information of a plurality of reference points defined on a substrate surface;
   a step of detecting, by a computing device, displacements of reference points in the vicinity of a target point in first and second coordinate axis directions based on said position information;
   a step of performing a computation for a displacement of said target point, wherein
   said step of performing the computation comprises, for displacements in one coordinate axis direction of said first and second coordinate axis directions, of said reference points in the vicinity of said target point,
   A: a first spline calculation step of calculating a first spline curve that indicates a relationship between displacement values and first coordinate axis values of reference points included in each group, said reference points included in said each group being aligned in said first coordinate axis direction and having a same second coordinate axis value,
   B: a first spline-indicated-value calculation step of calculating, as a first spline-indicated value, a value indicated by said first spline curve of said each group at a first coordinate axis value of said target point,
   C: a first sub-spline calculation step of calculating a first sub-spline curve that indicates a relationship between first spline-indicated values of respective groups and second coordinate axis values of said respective groups, and
   D: a first sub-spline-indicated-value calculation step of calculating a value indicated by said first sub-spline curve at a second coordinate axis value of said target point; and
   outputting the displacement of the target point.

2. The displacement calculation method according to claim 1, wherein
said step of performing a computation further executes, for said displacements in said one coordinate axis direction,
E: a second spline calculation step of calculating a second spline curve that indicates a relationship between displacement values and second coordinate axis values of reference points included in each group, said reference points included in said each group being aligned in said second coordinate axis direction and having a same first coordinate axis value,
F: a second spline-indicated-value calculation step of calculating, as a second spline-indicated value, a value indicated by said second spline curve of said each group at said second coordinate axis value of said target point,
G: a second sub-spline calculation step of calculating a second sub-spline curve that indicates a relationship between second spline-indicated values of respective groups and first coordinate axis values of said respective groups, and
H: a second sub-spline-indicated-value calculation step of calculating a value indicated by said second sub-spline curve at said first coordinate axis value of said target point, and
an average value of the value calculated in said first sub-spline-indicated-value calculation step and the value calculated in said second sub-spline-indicated-value calculation step is calculated.

3. The displacement calculation method according to claim 1, wherein
said step of performing a computation further executes said steps A through D for displacements in the other coordinate axis direction out of said first and second coordinate axis directions, of said reference points in the vicinity of said target point.

4. The displacement calculation method according to claim 1, wherein
said step of performing a computation further executes, for displacements in the other coordinate axis direction out of said first and second coordinate axis directions, of said reference points in the vicinity of said target point,
E: a second spline calculation step of calculating a second spline curve that indicates a relationship between displacement values and second coordinate axis values of reference points included in each group, said reference points included in said each group being aligned in said second coordinate axis direction and having a same first coordinate axis value,
F: a second spline-indicated-value calculation step of calculating, as a second spline-indicated value, a value indicated by said second spline curve of said each group at said second coordinate axis value of said target point,
G: a second sub-spline calculation step of calculating a second sub-spline curve that indicates a relationship between second spline-indicated values of respective groups and first coordinate axis values of said respective groups, and
H: a second sub-spline-indicated-value calculation step of calculating a value indicated by said second sub-spline curve at said first coordinate axis value of said target point.

5. The displacement calculation method according to claim 3, wherein
said step of performing a computation further executes, for said displacements in said other coordinate axis direction,
E: a second spline calculation step of calculating a second spline curve that indicates a relationship between displacement values and second coordinate axis values of reference points included in each group, said reference points included in said each group being aligned in the second coordinate axis direction and having a same first coordinate axis value,
F: a second spline-indicated-value calculation step of calculating, as a second spline-indicated value, a value indicated by said second spline curve of said each group at said second coordinate axis value of said target point,
G: a second sub-spline calculation step of calculating a second sub-spline curve that indicates a relationship between second spline-indicated values of respective groups and first coordinate axis values of said respective groups, and
H: a second sub-spline-indicated-value calculation step of calculating a value indicated by said second sub-spline curve at said first coordinate axis value of said target point, and
an average value of the value calculated in said first sub-spline-indicated-value calculation step and the value calculated in said second sub-spline-indicated-value calculation step is calculated.

6. A drawing data correction method comprising:
a step of preparing drawing data;
a step of calculating a displacement of a target point based on displacements of a plurality of reference points that are arranged in a grid on a surface of a substrate along a first coordinate axis direction and a second coordinate axis direction that intersect each other; and
a drawing data correction step of creating drawing data in which a position of a pixel to be drawn at said target point in the prepared drawing data is displaced based on a calculated displacement of said target point,
wherein said step of calculating a displacement of a target point is performed by a computing device and comprises:
a step of obtaining position information of said plurality of reference points defined on the substrate surface;
a step of detecting displacements of reference points in the vicinity of said target point in said first and second coordinate axis directions based on said position information; and
a step of performing a computation for said displacement of said target point, and
said step of performing a computation comprises, for displacements in one coordinate axis direction of said first and second coordinate axis directions, of said reference points in the vicinity of said target point,
A: a first spline calculation step of calculating a first spline curve that indicates a relationship between displacement values and first coordinate axis values of reference points included in each group, said reference points included in said each group being aligned in said first coordinate axis direction and having a same second coordinate axis value,
B: a first spline-indicated-value calculation step of calculating, as a first spline-indicated value, a value indicated by said first spline curve of said each group at a first coordinate axis value of said target point,
C: a first sub-spline calculation step of calculating a first sub-spline curve that indicates a relationship between first spline-indicated values of respective groups and second coordinate axis values of said respective groups, and D: a first sub-spline-indicated-value calculation step of calculating a value indicated by said first sub-spline curve at a second coordinate axis value of said target point; and outputting the displacement of the target point.

7. The drawing data correction method according to claim 6, wherein
said step of performing a computation further executes, for said displacements in said one coordinate axis direction,
E: a second spline calculation step of calculating a second spline curve that indicates a relationship between displacement values and second coordinate axis values of reference points included in each group, said reference points included in said each group being aligned in said second coordinate axis direction and having a same first coordinate axis value,
F: a second spline-indicated-value calculation step of calculating, as a second spline-indicated value, a value indicated by said second spline curve of said each group at said second coordinate axis value of said target point,
G: a second sub-spline calculation step of calculating a second sub-spline curve that indicates a relationship between second spline-indicated values of respective groups and first coordinate axis values of said respective groups, and
H: a second sub-spline-indicated-value calculation step of calculating a value indicated by said second sub-spline curve at said first coordinate axis value of said target point, and
an average value of the value calculated in said first sub-spline-indicated-value calculation step and the value calculated in said second sub-spline-indicated-value calculation step is calculated.

8. The drawing data correction method according to claim 6, wherein
said step of performing a computation further executes said steps A through D for displacements in the other coordinate axis direction out of said first and second coordinate axis directions, of said reference points in the vicinity of said target point.

9. The drawing data correction method according to claim 6, wherein
said step of performing a computation further executes, for displacements in the other coordinate axis direction out of said first and second coordinate axis directions, of said reference points in the vicinity of said target point,
E: a second spline calculation step of calculating a second spline curve that indicates a relationship between displacement values and second coordinate axis values of reference points included in each group, said reference points included in said each group being aligned in said second coordinate axis direction and having a same first coordinate axis value,
F: a second spline-indicated-value calculation step of calculating, as a second spline-indicated value, a value indicated by said second spline curve of said each group at said second coordinate axis value of said target point,
G: a second sub-spline calculation step of calculating a second sub-spline curve that indicates a relationship between second spline-indicated values of respective groups and first coordinate axis values of said respective groups, and
H: a second sub-spline-indicated-value calculation step of calculating a value indicated by said second sub-spline curve at said first coordinate axis value of said target point.

10. The drawing data correction method according to claim 8, wherein
said step of performing a computation further executes, for said displacements in said other coordinate axis direction,
E: a second spline calculation step of calculating a second spline curve that indicates a relationship between displacement values and second coordinate axis values of reference points included in each group, said reference points included in said each group being aligned in the second coordinate axis direction and having a same first coordinate axis value,
F: a second spline-indicated-value calculation step of calculating, as a second spline-indicated value, a value indicated by said second spline curve of said each group at said second coordinate axis value of said target point,
G: a second sub-spline calculation step of calculating a second sub-spline curve that indicates a relationship between second spline-indicated values of respective groups and first coordinate axis values of said respective groups, and
H: a second sub-spline-indicated-value calculation step of calculating a value indicated by said second sub-spline curve at said first coordinate axis value of said target point, and
an average value of the value calculated in said first sub-spline-indicated-value calculation step and the value calculated in said second sub-spline-indicated-value calculation step is calculated.

11. A substrate manufacturing method comprising:
a step of preparing drawing data;
a step of calculating a displacement of a target point based on displacements of a plurality of reference points that are arranged in a grid on a surface of a substrate along a first coordinate axis direction and a second coordinate axis direction that intersect each other;
a drawing data correction step of creating drawing data in which a position of a pixel to be drawn at said target point in the prepared drawing data is displaced based on a calculated displacement of said target point; and
a drawing step of performing drawing on a substrate based on drawing data corrected in said drawing data correction step, wherein
said step of calculating a displacement of a target point is performed by a computing device and comprises:
a step of obtaining position information of said plurality of reference points defined on the substrate surface;
a step of detecting displacements of reference points in the vicinity of said target point in said first and second coordinate axis directions based on said position information; and
a step of performing a computation for said displacement of said target point, and
said step of performing a computation comprises, for displacements in one coordinate axis direction of said first and second coordinate axis directions, of said reference points in the vicinity of said target point,
A: a first spline calculation step of calculating a first spline curve that indicates a relationship between displacement values and first coordinate axis values of reference points included in each group, said reference points included in said each group being aligned in said first coordinate axis direction and having a same second coordinate axis value,
B: a first spline-indicated-value calculation step of calculating, as a first spline-indicated value, a value indicated by said first spline curve of said each group at a first coordinate axis value of said target point, C: a first sub-spline calculation step of calculating a first sub-spline curve that indicates a relationship between first spline-indicated values of respective groups and second coordinate axis values of said respective groups, and D: a first sub-spline-indicated-value calculation step of calculating a value indicated by said first sub-spline curve at a second coordinate axis value of said target point; and outputting the displacement of the target point.

12. The substrate manufacturing method according to claim 11, wherein said step of performing a computation further executes, for said displacements in said one coordinate axis direction, E: a second spline calculation step of calculating a second spline curve that indicates a relationship between displacement values and second coordinate axis values of reference points included in each group, said reference points included in said each group being aligned in said second coordinate axis direction and having a same first coordinate axis value, F: a second spline-indicated-value calculation step of calculating, as a second spline-indicated value, a value indicated by said second spline curve of said each group at said second coordinate axis value of said target point, G: a second sub-spline calculation step of calculating a second sub-spline curve that indicates a relationship between second spline-indicated values of respective groups and first coordinate axis values of said respective groups, and H: a second sub-spline-indicated-value calculation step of calculating a value indicated by said second sub-spline curve at said first coordinate axis value of said target point, and an average value of the value calculated in said first sub-spline-indicated-value calculation step and the value calculated in said second sub-spline-indicated-value calculation step is calculated.

13. The substrate manufacturing method according to claim 11, wherein said step of performing a computation further executes said steps A through D for displacements in the other coordinate axis direction out of said first and second coordinate axis directions, of said reference points in the vicinity of said target point.

14. The substrate manufacturing method according to claim 11, wherein said step of performing a computation further executes, for displacements in the other coordinate axis direction out of said first and second coordinate axis directions, of said reference points in the vicinity of said target point, E: a second spline calculation step of calculating a second spline curve that indicates a relationship between displacement values and second coordinate axis values of reference points included in each group, said reference points included in said each group being aligned in said second coordinate axis direction and having a same first coordinate axis value, F: a second spline-indicated-value calculation step of calculating, as a second spline-indicated value, a value indicated by said second spline curve of said each group at said second coordinate axis value of said target point, G: a second sub-spline calculation step of calculating a second sub-spline curve that indicates a relationship between second spline-indicated values of respective groups and first coordinate axis values of said respective groups, and H: a second sub-spline-indicated-value calculation step of calculating a value indicated by said second sub-spline curve at said first coordinate axis value of said target point.

15. The substrate manufacturing method according to claim 13, wherein said step of performing a computation further executes, for said displacements in said other coordinate axis direction, E: a second spline calculation step of calculating a second spline curve that indicates a relationship between displacement values and second coordinate axis values of reference points included in each group, said reference points included in said each group being aligned in the second coordinate axis direction and having a same first coordinate axis value, F: a second spline-indicated-value calculation step of calculating, as a second spline-indicated value, a value indicated by said second spline curve of said each group at said second coordinate axis value of said target point, G: a second sub-spline calculation step of calculating a second sub-spline curve that indicates a relationship between second spline-indicated values of respective groups and first coordinate axis values of said respective groups, and H: a second sub-spline-indicated-value calculation step of calculating a value indicated by said second sub-spline curve at said first coordinate axis value of said target point, and an average value of the value calculated in said first sub-spline-indicated-value calculation step and the value calculated in said second sub-spline-indicated-value calculation step is calculated.

16. A drawing apparatus for drawing on a substrate having a surface on which a plurality of reference points are arranged in a grid along directions of a first coordinate axis and a second coordinate axis that intersect each other, the apparatus comprising:

a reception part configured to receive input of drawing data;

an image pickup part configured to capture an image of a surface of a substrate;

a position calculation part configured to calculate position information of a plurality of reference points in a captured image of a substrate surface;

a displacement detection part configured to detect displacements of reference points located in the vicinity of a target point in said drawing data in directions of first and second coordinate axes based on said position information;

a target-point displacement calculation part comprising a computing device and configured to calculate a displacement in the position of said target point based on displacement values detected by said displacement detection part;

a drawing data correction part configured to correct drawing data by displacing pixels to be drawn based on said displacement of said target point calculated by said displacement calculation part and the input drawing data; and a drawing part configured to perform drawing in accordance with the drawing data corrected by said drawing data correction part, wherein said target-point displacement calculation part comprises:

a first spline calculation part configured to calculate a first spline curve that indicates a relationship between displacement values of reference points included in each group and values of said reference points in one coordinate axis, said reference points included in said each group being aligned along the direction of said one coordinate axis and having a same value in the other coordinate axis;

a first spline-indicated-value calculation part configured to calculate, as a first spline-indicated value, a value indicated by said first spline curve of said each group at a value of said target point in said one coordinate axis;

a first sub-spline calculation part configured to calculate a first sub-spline curve that indicates a relationship between first spline-indicated values of respective groups and values of said respective groups in said other coordinate axis; and a first sub-spline-indicated-value calculation part configured to calculate a value indicated by said first sub-spline curve at a value of said target point in said other coordinate axis.

17. The drawing apparatus according to claim 16, further comprising:

a separation part configured to separate a displacement detected by said displacement detection part into a first coordinate axial component and a second coordinate axial component, wherein said target-point displacement calculation part calculates first and second coordinate axial components of displacement of said target point based on said first and second coordinate axial components separated by said separation part, respectively.

* * * * *